United States Patent [19]

Usui

[11] Patent Number: 4,916,395

[45] Date of Patent: Apr. 10, 1990

[54] METHOD AND APPARATUS FOR NUCLEAR MAGNETIC RESONANCE IMAGING USING LINEAR AND RESONANT TYPE AMPLIFIERS

[75] Inventor: Yoshiyuki Usui, Kuroiso, Japan

[73] Assignee: Kabushiki Kaisha Toshiba, Kawasaki, Japan

[21] Appl. No.: 298,626

[22] Filed: Jan. 18, 1989

[30] Foreign Application Priority Data

Jan. 29, 1988 [JP] Japan .................................. 63-17426

[51] Int. Cl.$^4$ ............................................. G01R 33/20
[52] U.S. Cl. ..................................... 324/307; 324/318
[58] Field of Search ............... 324/307, 318, 319, 322; 330/306; 139/143; 307/104

[56] References Cited

U.S. PATENT DOCUMENTS

| 4,319,198 | 3/1982 | Sosin | 330/306 |
| 4,442,404 | 4/1984 | Bergmann | 324/315 |
| 4,670,716 | 6/1987 | Kunz | 324/320 |

Primary Examiner—Hezron E. Williams
Assistant Examiner—Kevin D. O'Shea
Attorney, Agent, or Firm—Foley & Lardner, Schwartz, Jeffery, Schwaab, Mack, Blumenthal & Evans

[57] ABSTRACT

An apparatus for nuclear magnetic resonance imaging capable of obtaining images at arbitrary cross sectional planes with an ultra high speed imaging method using a gradient field amplifier of resonant amplification type. The apparatus includes both a linear type amplifier having three channels and a resonant type amplifier having at least two channels. A nuclear magnetic resonance imaging is carried out with both of the linear and resonant type amplifiers supplying currents to the gradient coils.

16 Claims, 5 Drawing Sheets (A)

(B)

(A) FOR ORDINARY IMAGING (B) FOR ULTRA HIGH SPEED IMAGING

METHOD AND APPARATUS FOR NUCLEAR MAGNETIC RESONANCE IMAGING USING LINEAR AND RESONANT TYPE AMPLIFIERS

BACKGROUND OF THE INVENTION

1. Field of the Invention

The present invention relates to a method and anapparatus for nuclear magnetic resonance imaging (referred hereafter as MRI) which utilizes nuclear magnetic resonance (referred hereafter as NMR) phenomena to obtain tomographic images of a body to be examined and, more particularly, to generating of gradient magnetic fields in such a method and an apparatus to be used with an ultra high speed imaging method such as an echo planar method.

2. Description of the Background Art

In order to apply an ultra high speed imaging method, the best known of which is an echo planar method, it is necessary to generate time-varying gradient magnetic fields of approximately 1 KHz frequency with strength several times stronger than those required by an ordinary imaging method such as a spin echo method, for the purpose of reading encoded information from NMR signals.

To achieve this, an amplifier of linear amplification type (referred hereafter as a linear type amplifier) ordinarily employed by an MRI apparatus to be used with an ordinary imaging method needs to possess an output capacity significantly more than ten times larger than usual, which is highly impractical.

On the other hand, there is a proposition to utilize an amplifier of resonant amplification type (referred hereafter as a resonant type amplifier) for this purpose, as it can generate strong enough magnetic fields while keeping its output capacitance reasonably small. This can be achieved by connecting a capacitor of an appropriate charge capacity, either in series or in parallel, between a gradient field coils which act as loading coils and the amplifier itself and thereby producing sinusoidal resonances.

However, with such a resonant type amplifier as an amplifier for the gradient fields for reading, it is not possible to obtain images at arbitrary cross sectional planes (called also slices) other than an axial plane A, a coronal plane C, and a sagittal plane S shown in FIG. 1, for the following reason.

In general, a cross sectional plane for MRI is specified in terms of a tilt angle $\Theta$ and a slew angle $\Phi$ defined as shown in FIG. 2(A) and FIG. 2(B), respectively.

Now, in order to obtain images at arbitrary cross sectional planes, three components $Gx(t)$, $Gy(t)$, and $Gz(t)$ of the time-varying gradient magnetic field in three orthogonal directions X, Y, and Z, respectively, are required to be generated in sequences (referred hereafter as pulse sequences) according to the expression:

$$Gx(t) = \sin\Phi \cdot Gz_0(t) + \cos\Phi \cdot Gx_0(t) \quad (1)$$

$$Gy(t) = -\sin\Theta\cos\Phi \cdot Gz_0(t) + \sin\Theta\sin\Phi \cdot Gx_0(t) + \cos\Theta \cdot Gy_0(t)$$

$$Gz(t) = \cos\Theta\cos\Phi \cdot Gz_0(t) - \cos\Theta\sin\Phi \cdot Gx_0(t) + \sin\Theta \cdot Gy_0(t)$$

where $Gx_0(t)$, $Gy_0(t)$, and $Gz_0(t)$ are the values of the components $Gx(t)$, $Gy(t)$, and $Gz(t)$, respectively, with the tilt angle $\Theta=0$ and the slew angle $\Phi=0$. Example of pulse sequences $Gx_0(t)$, $Gy_0(t)$, and $Gz_0(t)$ for the tilt angle $\Theta=0$ and the slew angle $\Phi=0$ are shown in FIG. 3 in which $Gx_0(t)$ represents a pulse sequence for encoding, $Gy_0(t)$ represents a pulse sequence for reading, and $Gz_0(t)$ represents a pulse sequence for slicing. Here, the role of the pulse sequences $Gx_0(t)$, and $Gy_0(t)$ are exchangeable.

It is to be noted that although the above expression and the pulse sequences are expressed in terms of strength of the magnetic field, they can be considered as indicating amounts of current to be produced by the gradient field amplifier as they are proportional to each other.

Thus, when the ultra speed imaging method is to be carried out by a conventional MRI apparatus equiped with a gradient field amplifier having three channels, one of the three channels must be reserved for resonant type of amplification to produce a pulse sequence for reading, and this makes the generating of the aforementioned pulse sequences in three orthogonal directions impossible so that images are not obtainable at arbitrary cross sectional planes.

Moreover, when switching the imaging method between the ultra high speed imaging method and the ordinary imaging method in such a conventional MRI apparatus, a time-consuming cable connection change associated with the replacement of the resonant type amplifier by that of the linear type is necessary.

SUMMARY OF THE INVENTION

It is therefore an object of the present invention to provide a method and an apparatus for MRI capable of obtaining images at arbitrary cross sectional planes with an ultra high speed imaging method using a gradient field amplifier of resonant type.

Another object of the present invention is to provide a method and an apparatus for MRI capable of changing imaging methods among ultra high speed methods and other methods automatically.

According to one aspect of the present invention there is provided an apparatus for nuclear magnetic resonance imaging, comprising: gradient coils for generating gradient magnetic fields; linear tye amplifier means having three channels for supplying currents to the gradient coils; and resonant type amplifier means having at leaast two channels for supplying currents to the gradient coils.

According to another aspect of the present invention there is provided a method of nuclear magnetic resonance imaging by a nuclear magnetic resonance imaging apparatus having gradient coils, comprising the steps of: supplying currents to the gradient coils by linear type amplifier having three channels; supplying current to the gradient coils by resonant type amplifier having at least two channels; and taking nuclear magnetic resonance images by an ultra high speed imaging method.

Other features and objects of the present invention will become apparent from the following description taken in conjunction with the accompanying drawings.

DETAILED DESCRIPTION OF THE PREFERRED EMBODIMENTS

Figure 4:
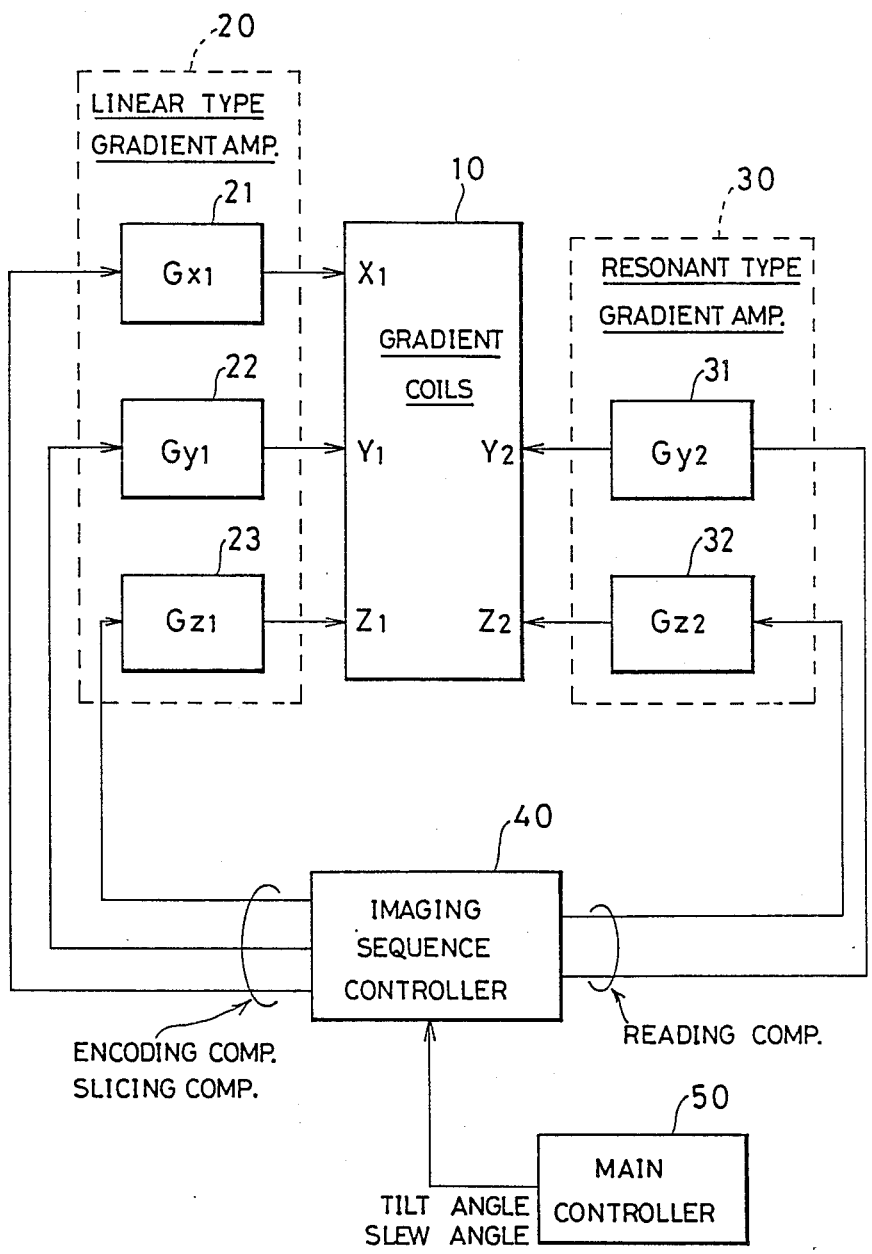
FIG. 4 is a schematic block diagram of an essential part of one embodiment of MRI apparatus according to the present invention.

Referring now to FIG. 4, there is shown an essential part of one embodiment of MRI apparatus according to the present invention.

In this embodiment, there is provided gradient coils 10 comprised of one coil X1 for generating gradient magnetic field in x-direction, two other coils Y1 and Y2 for generating gradient magnetic fields in y-direction, and two further coils Z1 and Z2 for generating gradient fields in z-direction. To supply currents to this gradient coils 10, there are provided two gradient amplifiers, one linear type gradient amplifier 20 and another resonant type gradient amplifier 30. The linear type gradient amplifier 20 comprises three linear type amplifiers 21, 22, and 23 as three independent channels, which feed the coils X1, Y1, and Z1, respectively. The resonant type gradient amplifier 30 comprises two resonant type amplifiers 31 and 32 as two independent channels, which feed the coil Y2 and Z2, respectively. Amounts of currents to be supplied by these two gradient amplifiers are controlled according to pulse sequences generated by an imaging sequence controller 40. The imaging sequence controller 40 produces such pulse sequences in accordance with a tilt angle $\Theta$ and a slew angle $\Phi$ provided by a main controller 50. Other features of this MRI apparatus not shown, such as a main magnet for generating static magnetic field, and a probe coil for irradiating excitation fields commonly called RF pulses and detecting NMR signals are the same as conventional one.

The operation of this embodiment will now be described.

Figure 1:
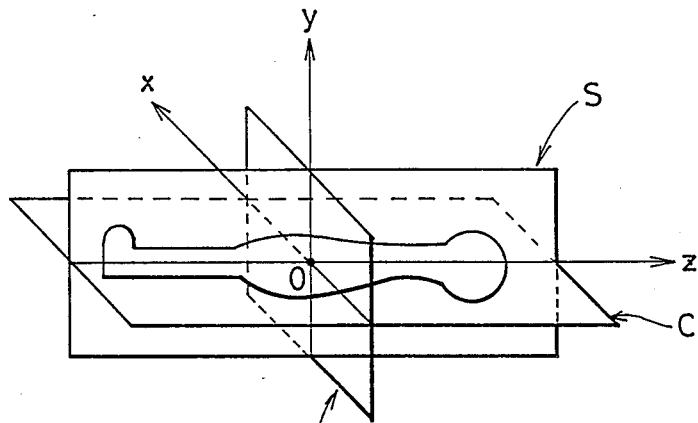
FIG. 1 is a illustration showing an axial plane, a coronal plane, and a sagittal plane.
Figure 2:
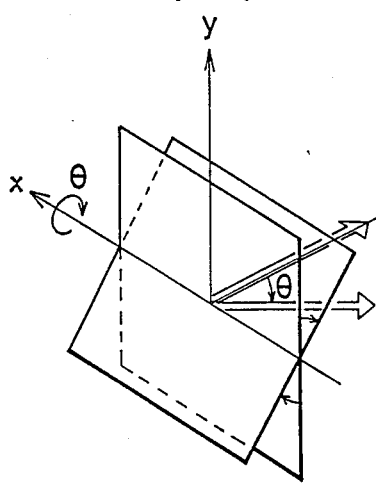
FIG. 2(A) and 2(B) are illustration showing a tilt angle and a slew angle.
Figure 2:
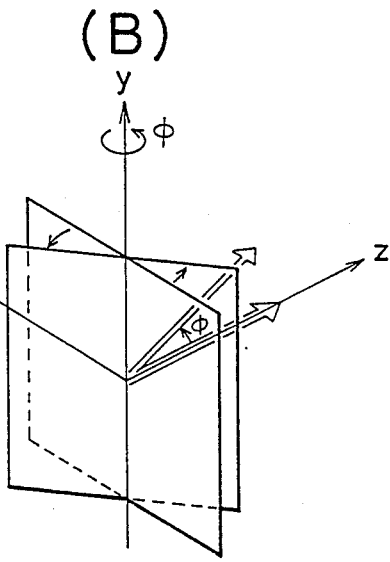
Figure 3:
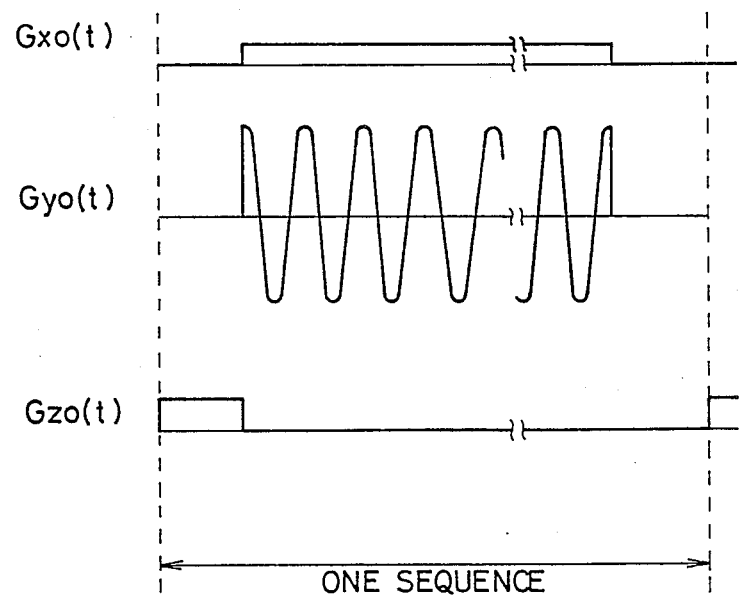
FIG. 3 is a diagram of pulse sequences for the gradient magnetic field.

The linear type amplifiers 21, 22, and 23 are controlled by the imaging sequence controller 40 to supply currents to the coils X1, Y1, X1, respectively, such that the gradient magnetic fields Gx1(t), Gy1(t), and Gz1(t), respectively, are generated in forms of pulse sequences given by the expressions:

$$Gx1(t) = \sin\Phi \cdot Gz0(t) + \cos\Theta \cdot Gx0(t) \quad (2)$$

$$Gy1(t) = -\sin\Theta\cos\Phi \cdot Gz0(t) + \sin\Theta\sin\Phi \cdot Gx0(t)$$

$$Gz1(t) = \cos\Theta\cos\Phi \cdot Gz0(t) - \cos\Theta\sin\Phi \cdot Gx0(t)$$

where, as in the description of the background art, Gx0(t), Gy0(t), and Gz0(t) are the values of the components Gx(t), Gy(t), and Gz(t), respectively, with the tilt angle $\Theta=0$ and the slew angle $\Phi=0$. The same example as in the description of the background art of the pulse sequences Gx0(t), Gy0(t), and Gz0(t) shown in FIG. 3 in which Gx0(t) represents a pulse sequence for encoding, Gy0(t) represents a pulse sequence for reading, and Gz0(t) represents a pulse sequence for slicing, are to be used in this embodiment. As remarked earlier, the role of the pulse sequences Gx0(t) and Gy0(t) are exchangeable.

On the other hand, the resonant type amplifiers 31 and 32 are controlled by the imaging sequence controller 40 to supply currents to the coils Y2 and Z2, respectively, such that the gradient magnetic fields Gy2(t) and Gz2(t), respectively, are generated in forms of another pulse sequences given by the expressions:

$$Gy2(t) = \cos\Theta \cdot Gy0(t)$$

$$Gz2(t) = \sin\Theta \cdot Gy0(t) \quad (3)$$

As a result, by supserposing these gradient magnetic fields generated by the linear type amplifiers and the resonant type amplifiers, the desired gradient magnetic fields suitable for imaging at arbitrary cross sectional planes given by the equation (1) above can be obtained.

Moreover, since the pulse sequences for resonant type amplifiers 31 and 32 given by the equation (3) are determined solely in terms of the pulse sequence for reading Gy0(t), so that this part of the gradient magnetic fields are free from the influences due to the pulse sequences for encoding and slicing Gx0(t) and Gz0(t).

Thus, according to this embodiment, it is possible to take images by an ultra high speed imaging method at arbitrary cross sectional planes.

Figure 5:
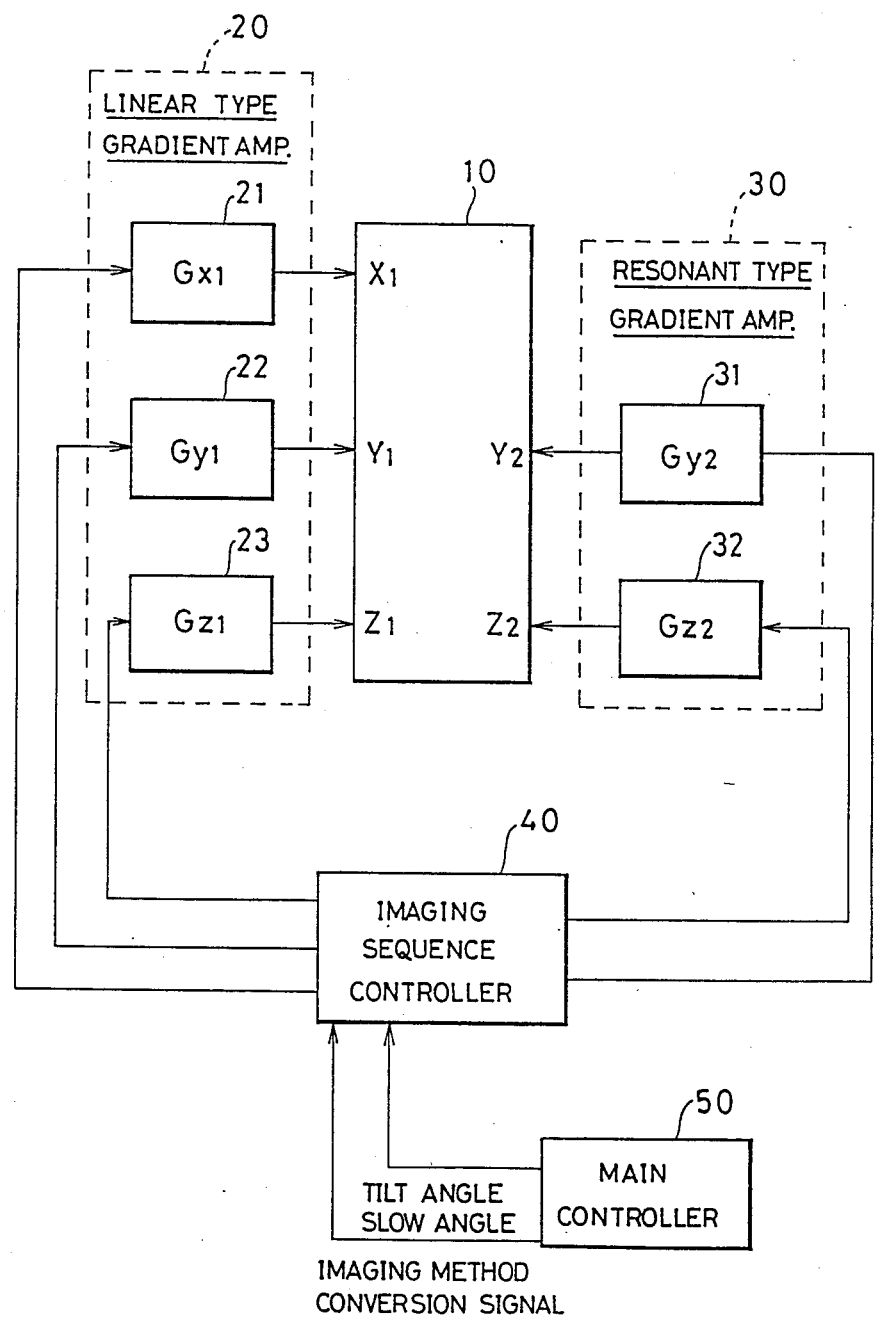
FIG. 5 is a schematic block diagram of an essential part of another embodiment of MRI apparatus according to the present invention.
Figure 6:
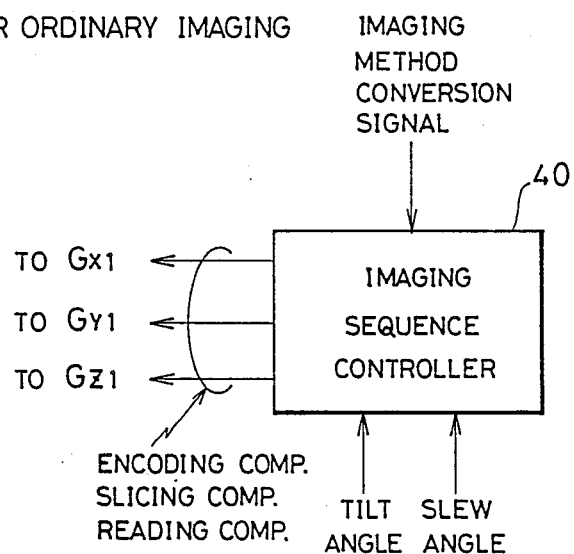
FIG. 6(A) and 6(B) are diagrams showing signals in and out of an imaging sequence controller of the MRI apparatus shown in FIG. 5 for different imaging methods.
Figure 6:
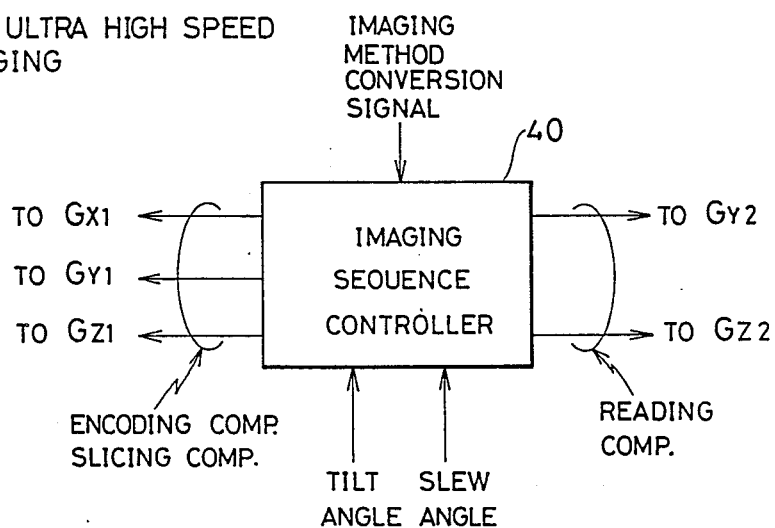

Referring now to FIG. 5, there is shown an essential part of another embodiment of MRI apparatus according to the present invention. Here, those portions of this second embodiment which are equivalent to the corresponding portions of the previous embodiment are given the same labels, and their explanations are not repeated. In this second embodiment, the imaging sequence controller 140 can control the gradient amplifiers 20 and 30 in different manners according to imaging method specified by imaging method conversion signal from the main controller 150, as shown in FIG. 6(A) and 6(B).

More specifically, when the imaging method conversion signal indicates an ordinary imaging method, the linear type amplifiers 21, 22, and 23 are controlled such that the gradient coil X1, Y1, and Z1 generate gradient magnetic fields according to the pulse sequence given by the equation (1), whereas the resonant type amplifiers 31 and 32 are controlled such that no current is supplied to the gradient coils Y2 and Z2, so that this embodiment effectively functions as an ordinary MRI apparatus using an ordinary imaging method.

On the other hand, when the imaging method conversion signal indicates an ultra high speed imaging method, the linear type gradient amplifier 20 and the resonant type gradient amplifier 30 are controlled as in the previous embodiment.

As a result, according to this embodiment, when switching imaging method between an ordinary one and an ultra high speed one, time-consuming cable connection changes associated with the replacement of the amplifier of resonant amplification type by that of linear amplification type necessary in both a conventional MRI apparatus as well as in the previous embodiment becomes unnecessary.

It is to be noted that many modifications and variations of these embodiments may be made without departing from the novel and advantageous features of the present invention. Accordingly, all such modifications and variations are intended to be included within the scope of the appended claims.

What is claimed is:

1. An apparatus for nuclear magnetic resonance imaging, comprising:
   gradient coils for generating gradient magnetic fields;
   linear type amplifier means having three channels for supplying currents to the gradient coils; and
   resonant type amplifier means having at least two channels for supplying currents to the gradient coils.

2. The apparatus of claim 1, wherein the gradient coils comprises:
   first coils for generating first gradient magnetic fields in three orthogonal directions; and
   second coils for generating second gradient magnetic fields at least in two orthogonal directions; and
   wherein the linear type amplifier means supply currents to the first coils, and the resonant type amplifier means supply currents to the second coils.

3. The apparatus of claim 2, further comprising means for controlling amounts of currents to be supplied by the linear type amplifier means and the resonant type amplifier means such that the first and second gradient magnetic fields combined form a sequence satisfying conditions for imaging at arbitrary cross sectional planes.

4. The apparatus of claim 3, wherein the controlling by the controlling means is such that amounts of currents to be supplied by the resonant type amplifier means depend only on a sequence of time varying gradient magnetic fields to be generated for the purpose of reading, but not on sequences of time varying gradient magnetic fields to be generated for the purpose of slicing and encoding.

5. The apparatus of claim 4, wherein the controlling by the controlling means is such that amounts of currents to be supplied by the linear type amplifier means depend only on sequences of time varying gradient magnetic fields to be generated for the purpose of slicing and encoding, but not on a sequence of time varying gradient magnetic fields to be generated for the purpose of reading.

6. The apparatus of claim 3, further comprising means for commanding the controlling means according to method of imaging to be used, and wherein the controlling means controls amounts of currents to be supplied by the linear type amplifier means and the resonant type amplifier means such that the first and second gradient magnetic fields combined forms a sequence satisfying conditions for imaging at arbitrary cross sectional planes when an ultra high speed imaging method is to be used, whereas the controlling means controls amounts of currents to be supplied by the linear type amplifier means and the resonant type amplifier means such that the first gradient magnetic fields form a sequence satisfying conditions for imaging at arbitrary cross sectional planes and the resonant type amplifier means supply no current when an ordinary imaging method is to be used.

7. The apparatus of claim 6, wherein the controlling by the controlling means is such that amounts of currents to be supplied by the resonant type amplifier means depend only on a sequence of time varying gradient magnetic fields to be generated for the purpose of reading, but not on sequences of time varying gradient magnetic fields to be generated for the purpose of slicing and encoding.

8. The apparatus of claim 7, wherein the controlling by the controlling means is such that amounts of currents to be supplied by the linear type amplifier means depend only on sequences of time varying gradient magnetic fields to be generated for the purpose of slicing and encoding, but not on a sequence of time varying gradient magnetic fields to be generated for the purpose of reading.

9. A method of nuclear magnetic resonance imaging by a nuclear magnetic resonance imaging apparatus having gradient coils, comprising the steps of: supplying currents to the gradient coils by linear type amplifier having three channels;
   supplying currents to the gradient coils by resonant type amplifier having at least two channels; and
   taking nuclear magnetic resonance images by an ultra high speed imaging method.

10. The method of claim 9, wherein the gradient coils comprises:
    first coils for generating first gradient magnetic fields in three orthogonal directions; and
    second coils for second generating gradient magnetic fields at least in two orthogonal directions; and
    wherein the linear type amplifier supplies currents to the first coils, and the resonant type amplifier supplies currents to the second coils.

11. The method of claim 10, further comprising the step of controlling amounts of currents to be supplied by the linear type amplifier and the resonant type amplifier such that the first and second gradient magnetic fields combined form a sequence satisfying conditions for imaging at arbitrary cross sectional planes.

12. The method of claim 11, wherein the controlling is such that amounts of currents to be supplied by the resonant type amplifier depend only on a sequence of time varying gradient magnetic fields to be generated for the purpose of reading, but not on sequences of time varying gradient magnetic fields to be generated for the purpose of slicing and encoding.

13. The method of claim 12, wherein the controlling is such that amounts of currents to be supplied by the linear type amplifier depend only on sequences of time varying gradient magnetic fields to be generated for the purpose of slicing and encoding, but not on a sequence of time varying gradient magnetic fields to be generated for the purpose of reading.

14. The method for claim 11, further comprising the steps of controlling amounts of currents to be supplied by the linear type amplifier and the resonant type amplifier such that the first and second gradient magnetic fields combined forms a sequence satisfying conditions for imaging at arbitrary cross sectional planes when an ultra high speed imaging method is to be used, and controlling amounts of currents to be supplied by the linear type amplifier and the resonant type amplifier such that the first gradient magnetic fields form a sequence satisfying conditions for imaging at arbitrary cross sectional planes and the resonant type amplifier supply no current when an ordinary imaging method is to be used.

15. The method of claim 14, wherein the controlling is such that amounts of currents to be supplied by the resonant type amplifier depend only on a sequence of time varying gradient magnetic fields to be generated for the purpose of reading, but not on sequences of time varying gradient magnetic fields to be generated for the purpose of slicing and encoding.

16. The method of claim 15, wherein the controlling is such that amounts of currents to be supplied by the linear type amplifier depend only on sequences of time varying gradient magnetic fields to be generated for the purpose of slicing and encoding, but not on a sequence of time varying gradient magnetic fields to be generated for the purpose of reading.

* * * * *